(12) United States Patent
Inokuchi

(10) Patent No.: US 11,984,386 B2
(45) Date of Patent: May 14, 2024

(54) SEMICONDUCTOR DEVICE

(71) Applicant: FUJI ELECTRIC CO., LTD., Kawasaki (JP)

(72) Inventor: Hisato Inokuchi, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 87 days.

(21) Appl. No.: 17/387,730

(22) Filed: Jul. 28, 2021

(65) Prior Publication Data
US 2021/0358835 A1 Nov. 18, 2021

Related U.S. Application Data

(63) Continuation of application No. PCT/JP2020/025468, filed on Jun. 29, 2020.

(30) Foreign Application Priority Data

Aug. 13, 2019 (JP) .................................. 2019-148518

(51) Int. Cl.
*H01L 23/495* (2006.01)
*H01L 23/02* (2006.01)

(52) U.S. Cl.
CPC ........ *H01L 23/49541* (2013.01); *H01L 23/02* (2013.01); *H01L 23/49517* (2013.01)

(58) Field of Classification Search
None
See application file for complete search history.

(56) References Cited

U.S. PATENT DOCUMENTS 5,471,089 A 11/1995 Nagatomo et al.
5,956,231 A 9/1999 Yamada et al.
(Continued)

FOREIGN PATENT DOCUMENTS

CN 108780792 A 11/2018
EP 0578108 A1 1/1994
(Continued)

OTHER PUBLICATIONS

International Search Report for PCT/JP2020/025468, dated Sep. 15, 2020.
(Continued)

*Primary Examiner* — Nishath Yasmeen
(74) *Attorney, Agent, or Firm* — Rabin & Berdo, P.C.

(57) ABSTRACT

A semiconductor device includes a semiconductor element, a substrate including an insulating board, and first conductive plate and second conductive plate on the insulating board, and a wiring unit including a first lead frame electrically connected to the first conductive plate and having a first wiring portion wired parallel to the insulating board, a second lead frame electrically connected to the second conductive plate, and having a second wiring portion above the first lead frame and overlapping the first wiring portion in a plan view at a superimposed area, a gap between the first and second lead frames being formed in the superimposed area, and a wiring holding portion holding the first and second lead frames. The wiring holding portion includes a wiring gap portion which fills in the gap, and a wiring surface portion disposed over the second wiring portion in the superimposed area.

13 Claims, 8 Drawing Sheets

(56) References Cited

U.S. PATENT DOCUMENTS

| | | |
|---|---|---|
| 2008/0150102 A1 | 6/2008 | Yokomae et al. |
| 2009/0218666 A1* | 9/2009 | Yang .................. H01L 23/4334 |
| | | 438/107 |
| 2015/0115423 A1* | 4/2015 | Yamashita .......... H01L 27/0629 |
| | | 257/675 |
| 2018/0240732 A1 | 8/2018 | Tonedachi |
| 2019/0051636 A1 | 2/2019 | Tonedachi |
| 2019/0067165 A1* | 2/2019 | Soda .................... H01L 23/495 |
| 2019/0295932 A1* | 9/2019 | Nakata .................. H01L 25/07 |
| 2020/0020622 A1 | 1/2020 | Kaji et al. |

FOREIGN PATENT DOCUMENTS

| | | |
|---|---|---|
| JP | H06-21323 A | 1/1994 |
| JP | 2004-214452 A | 7/2004 |
| JP | 2006-210500 A | 8/2006 |
| JP | 2008-098585 A | 4/2008 |
| JP | 2014-075521 A | 4/2014 |
| JP | 2015-198227 A | 11/2015 |
| JP | 2018-137283 A | 8/2018 |
| WO | WO 2017/169134 * | 2/2017 |
| WO | WO-2017/169134 * | 2/2017 |
| WO | 2017/169134 A1 | 10/2017 |
| WO | 2018/185974 A1 | 10/2018 |

OTHER PUBLICATIONS

Written Opinion for PCT/JP2020/025468, dated Sep. 15, 2020.
International Search Report for PCT/JP2020/025468, mailed on Sep. 15, 2020.
Written Opinion for PCT/JP2020/025468, mailed on Sep. 15, 2020.
Chinese Office Action dated Mar. 21, 2024, in the counterpart Chinese Patent Application No. 202080011198.7.

* cited by examiner

SEMICONDUCTOR DEVICE

CROSS-REFERENCE TO RELATED APPLICATION

This application is a continuation application of International Application PCT/JP2020/025468 filed on Jun. 29, 2020 which designated the U.S., which claims priority to Japanese Patent Application No. 2019-148518, filed on Aug. 13, 2019, the entire contents of which are incorporated herein by reference.

BACKGROUND OF THE INVENTION

1. Field of the Invention

The embodiments discussed herein relate to a semiconductor device.

2. Background of the Related Art

Semiconductor devices include semiconductor elements such as an insulated gate bipolar transistor (IGBT) and a power metal oxide semiconductor field effect transistor (MOSFET). For example, these semiconductor devices are used as power converters.

A semiconductor device includes semiconductor elements including the above semiconductor elements. With the semiconductor device these semiconductor elements are arranged over conductive patterns. With the semiconductor device, semiconductor elements are electrically connected by a bonding wire and a semiconductor element and a conductive pattern are electrically connected by a bonding wire. Furthermore, one end of a lead frame is electrically connected to a conductive pattern and the other end of the lead frame is exposed from a lid portion of a case. A control signal and the like are inputted from the outside. It is difficult to ensure rigidity or the distance between terminals only by this lead frame. Accordingly, a plurality of lead frames are integrally formed by insert molding. In addition, the semiconductor elements, bonding wires, and the plurality of lead frames integrally formed by insert molding are sealed with silicone gel or the like.

Japanese Laid-open Patent Publication No. 2015-198227

With the above semiconductor device, however, there is a case where all of the semiconductor elements, the bonding wires, and the plurality of lead frames integrally formed by insert molding are not sealed with the silicone gel with which the case is filled. If the sealing surface of the silicone gel crosses the plurality of lead frames integrally formed and a high voltage is applied, then a current flows along the sealing surface between lead frames. As a result, a short circuit may occur.

SUMMARY OF THE INVENTION

According to an aspect, there is provided a semiconductor device, including: a semiconductor element; a substrate which includes an insulating board having a front surface, and a first conductive plate and a second conductive plate that are disposed on the front surface of the insulating board, the semiconductor element being disposed on one of the first and second conductive plates at a side opposite to a side in which the insulating board is disposed; and a wiring unit including a first lead frame electrically connected to the first conductive plate and having a first wiring portion wired parallel to the front surface of the insulating board, a second lead frame electrically connected to the second conductive plate, and having a second wiring portion above the first lead frame and overlapping the first wiring portion in a plan view of the semiconductor device at a superimposed area, a gap between the first lead frame and the second lead frame being formed in the superimposed area in a direction orthogonal to the front surface of the insulating board, and a wiring holding portion holding the first lead frame and the second lead frame, the wiring holding portion including a wiring gap portion which fills in the gap in the superimposed area, and a wiring surface portion disposed over the second wiring portion in the superimposed area.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Embodiments will now be described by reference to the accompanying drawings. In the following description a "front surface" or an "upper surface" indicates a surface of a semiconductor device 10 of FIG. 1 which faces upward. Similarly, an "upside" indicates the upper side of the semiconductor device 10 of FIG. 1. A "back surface" or a "lower surface" indicates a surface of the semiconductor device 10 of FIG. 1 which faces downward. Similarly, a "downside" indicates the lower side of the semiconductor device 10 of FIG. 1. These terms mean the same directions at need in the other drawings. The "front surface," the "upper surface," the "upside," the "back surface," the "lower surface," the "downside," and a "side" are simply used as expedient representation for specifying relative positional relationships and do not limit the technical idea of the present disclosure. For example, the "upside" or the "downside" does not always mean the vertical direction relative to the ground. That is to say, a direction indicated by the "upside" or the "downside" is not limited to the gravity direction.

First Embodiment

A semiconductor device according to a first embodiment will be described by the use of FIG. 1 through FIG. 5. FIG.

Figure 1:
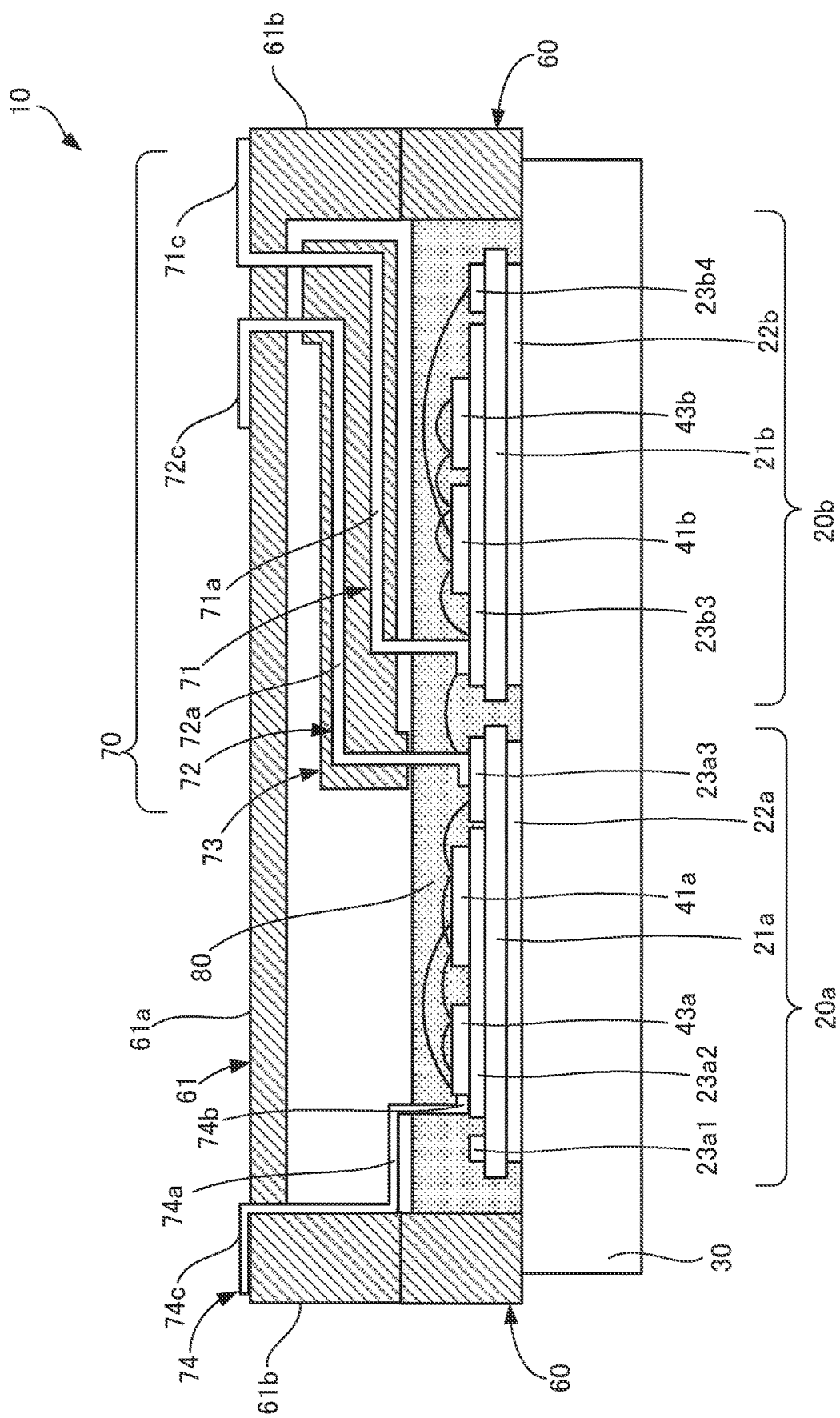
FIG. 1 is a sectional side elevation view of a semiconductor device according to a first embodiment.
Figure 2:
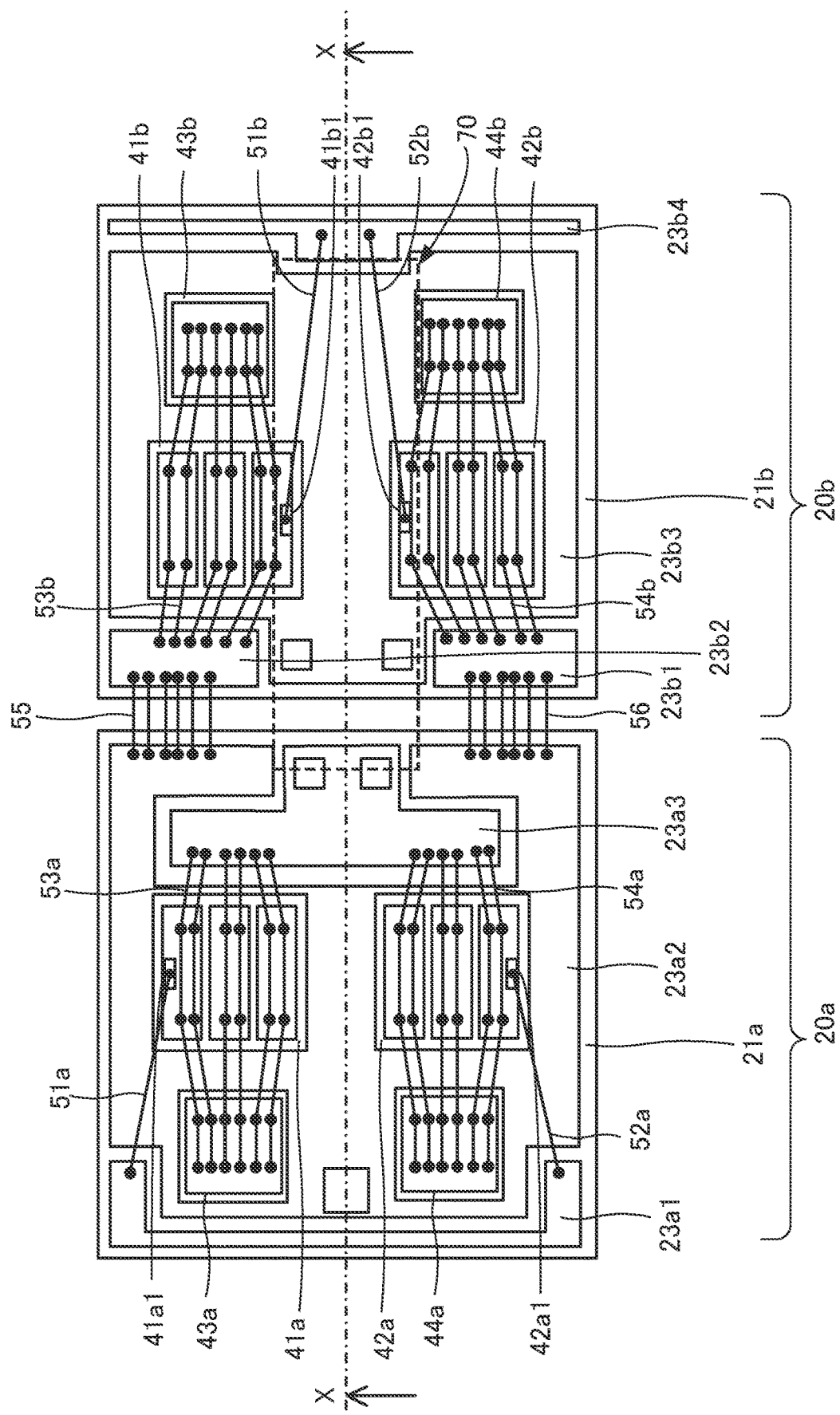
FIG. 2 is a plan view of a ceramic circuit board included in the semiconductor device according to the first embodiment.
Figure 3:
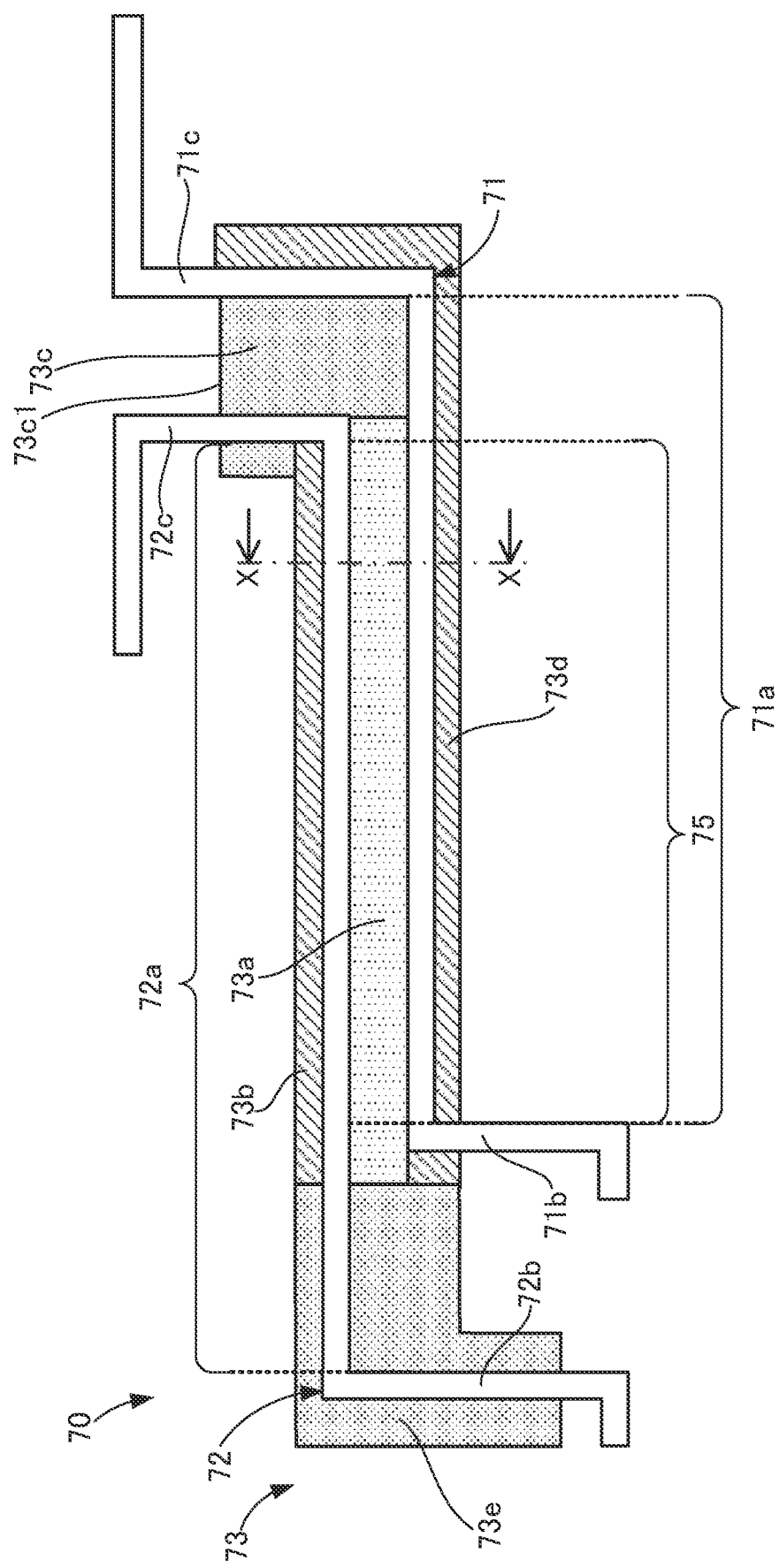
FIG. 3 is a view for describing a wiring unit included in the semiconductor device according to the first embodiment (part 1)
Figure 4A:
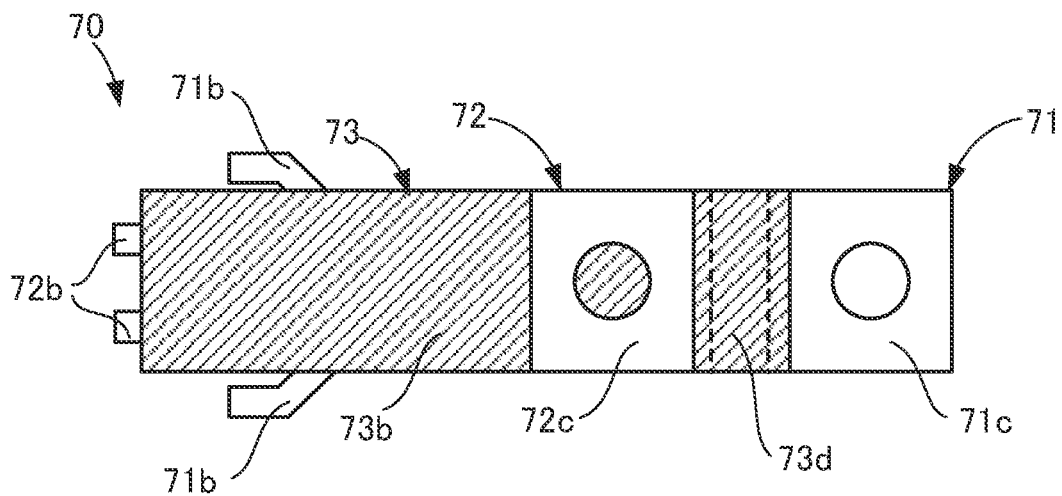
FIGS. 4A, 4B, and 4C are views for describing a wiring unit included in the semiconductor device according to the first embodiment (part 2)
Figure 4B:
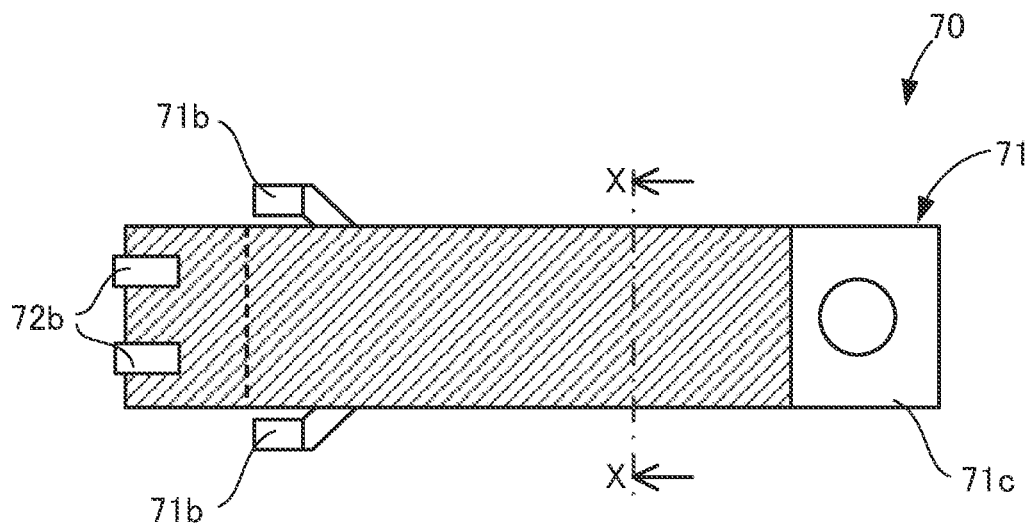
Figure 4C:
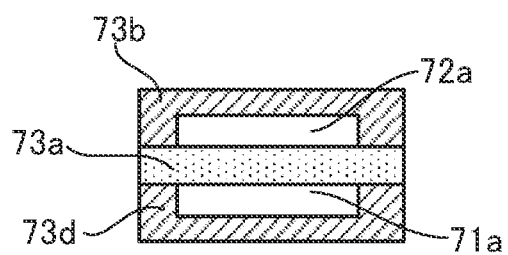
Figure 5:
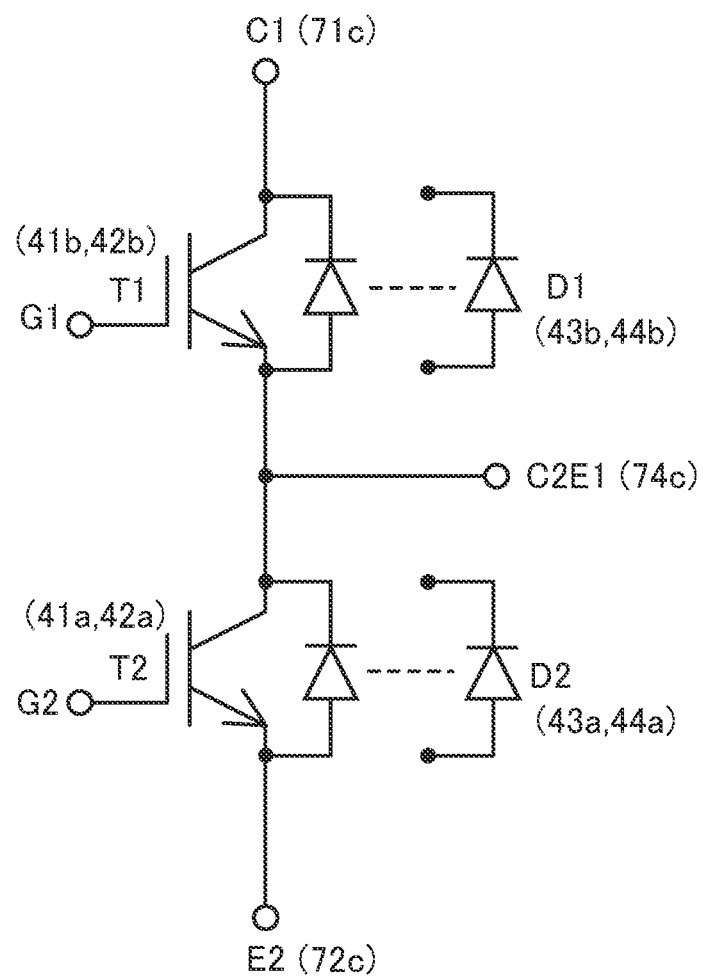
FIG. 5 illustrates circuit structure included in the semiconductor device according to the first embodiment.

1 is a sectional side elevation view of a semiconductor device according to a first embodiment. FIG. 2 is a plan view of a ceramic circuit board included in the semiconductor device according to the first embodiment. FIG. 3 and FIGS. 4A, 4B, and 4C are views for describing a wiring unit included in the semiconductor device according to the first embodiment. FIG. 5 illustrates circuit structure included in the semiconductor device according to the first embodiment. FIG. 1 corresponds to a sectional view taken along the dot-dash line X-X of FIG. 2. Furthermore, FIG. 3 is a sectional side elevation view of a wiring unit 70. FIG. 4A is a plan view of the wiring unit 70. FIG. 4B is a back view of the wiring unit 70. FIG. 4C is a sectional view taken along the dot-dash line X-X of FIG. 3 or FIG. 4B. In addition, in order to explain parts of a wiring holding portion 73 of the wiring unit 70, the type of hatching is changed according to the parts in FIG. 3. However, in reality all the wiring holding portion 73 is made of the same material.

As illustrated in FIG. 1, the semiconductor device includes ceramic circuit boards 20a and 20b and a radiation plate 30 over whose front surface the ceramic circuit boards 20a and 20b are located. As illustrated in FIG. 2, semiconductor elements 41a through 44a and 41b through 44b are arranged over the ceramic circuit boards 20a and 20b respectively. In FIG. 1, the semiconductor element 42a, 44a, 42b, or 44b is not illustrated. Furthermore, the semiconductor device 10 includes a case portion 60 which is located over a peripheral edge portion of the radiation plate 30 and which encloses the ceramic circuit boards 20a and 20b and a lid portion 61 located over an opening of the case portion 60. In addition, external connection terminals are fixed to the case portion 60 and the lid portion 61 for making an electrical connection to an external device. First through third lead frames 71, 72, and 74 are fixed as external connection terminals for principal current. Control lead frames are not illustrated. One end portion of the first lead frame 71 is electrically connected to the ceramic circuit board 20b and a first terminal portion 71c, which is the other end portion, of the first lead frame 71 is exposed on a front surface of the lid portion 61. One end portion of the second lead frame 72 is electrically connected to the ceramic circuit board 20a and a second terminal portion 72c, which is the other end portion, of the second lead frame 72 is exposed on the front surface of the lid portion 61. One end portion of the third lead frame 74 is electrically connected to the ceramic circuit board 20a and a third terminal portion 74c, which is the other end portion, of the third lead frame 74 is exposed on the front surface of the lid portion 61. The first and second lead frames 71 and 72 are included in the wiring unit 70 integrally molded with the wiring holding portion 73. Furthermore, in this case, insulation between the first and second lead frames 71 and 72 is maintained by the wiring holding portion 73. The details of the wiring unit 70 will be described later (FIG. 3). Moreover, the ceramic circuit boards 20a and 20b (and bonding wires) inside the case portion 60 are sealed with a sealing member 80. The inside of the case portion 60 is filled with the sealing member 80 to a level just under a back surface of the first lead frame 71 of the wiring unit 70 illustrated in FIG. 1. That is to say, there is a gap (second interface gap) between the back of the wiring unit 70 and a front surface of the sealing member 80.

As illustrated in FIG. 1 and FIG. 2, the ceramic circuit board 20a includes an insulating plate 21a, a metal plate 22a formed on a back surface of the insulating plate 21a, and conductive patterns 23a1 through 23a3 formed over a front surface of the insulating plate 21a. As illustrated in FIG. 1 and FIG. 2, the ceramic circuit board 20b includes an insulating plate 21b, a metal plate 22b formed on a back surface of the insulating plate 21b, and conductive patterns 23b1 through 23b4 formed over a front surface of the insulating plate 21b. The shape or number of the conductive patterns 23a1 through 23a3 or the conductive patterns 23b1 through 23b4 is an example. The insulating plates 21a and 21b are made of a ceramic, such as aluminum oxide, aluminum nitride, or silicon nitride, having high thermal conductivity. The metal plates 22a and 22b are made of metal, such as aluminum, iron, silver, copper, or an alloy containing at least one of them, having high thermal conductivity. The conductive patterns 23a1 through 23a3 and 23b1 through 23b4 are made of metal, such as copper or a copper alloy, having good electrical conductivity. direct copper bonding (DCB) substrates, active metal brazed (AMB) substrates, or the like may be used as the ceramic circuit boards 20a and 20b each having the above structure. The ceramic circuit board 20a transfers via the conductive pattern 23a2, the insulating plate 21a, and the metal plate 22a heat generated by the semiconductor elements 41a through 44a to the underside in FIG. 1 to dissipate it. The ceramic circuit board 20b transfers via the conductive pattern 23b3, the insulating plate 21b, and the metal plate 22b heat generated by the semiconductor elements 41b through 44b to the underside in FIG. 1 to dissipate it. Furthermore, the first lead frame 71 (first bonding portion 71b (FIG. 3)) is connected to the conductive pattern 23b3 of the ceramic circuit board 20b with solder (not illustrated) therebetween. The second lead frame (second bonding portion 72b (FIG. 3)) is connected to the conductive pattern 23a3 of the ceramic circuit board 20a with solder (not illustrated) therebetween. The third lead frame (third bonding portion 74b (FIG. 3)) is connected to the conductive pattern 23a2 of the ceramic circuit board 20a with solder (not illustrated) therebetween. Squares on the conductive patterns 23a2, 23a3, and 23b3 indicate areas to which the third lead frame 74, the second lead frame 72, and the first lead frame 71, respectively, are bonded.

Each of the semiconductor elements 41a, 42a, 41b, and 42b is a switching element such as an IGBT or a power MOSFET. For example, the semiconductor element 41a has an input electrode (drain electrode or a collector electrode) as a main electrode on the back surface and has a control electrode (gate electrode) 41a1 and an output electrode (source electrode or an emitter electrode) as a main electrode on the front surface. The semiconductor element 42a has an input electrode (drain electrode or a collector electrode) as a main electrode on the back surface and has a control electrode (gate electrode) 42a1 and an output electrode (source electrode or an emitter electrode) as a main electrode on the front surface. The semiconductor element 41b has an input electrode (drain electrode or a collector electrode) as a main electrode on the back surface and has a control electrode (gate electrode) 41b1 and an output electrode (source electrode or an emitter electrode) as a main electrode on the front surface. The semiconductor element 42b has an input electrode (drain electrode or a collector electrode) as a main electrode on the back surface and has a control electrode (gate electrode) 42b1 and an output electrode (source electrode or an emitter electrode) as a main electrode on the front surface. The back surfaces of the semiconductor elements 41a and 42a and the back surfaces of the semiconductor elements 41b and 42b are bonded to the conductive patterns 23a2 and 23b3, respectively, with solder (not illustrated). Each of the semiconductor elements 43a, 44a, 43b, and 44b includes a diode such as a Schottky barrier diode (SBD) or a free wheeling diode (FWD). Each of the semiconductor elements 43a, 44a, 43b, and 44b has an output electrode (cathode electrode) as a main electrode on the back surface and has an input electrode (anode electrode) as a main electrode on the front surface. The back surfaces of the semiconductor elements 43a and 44a and the back surfaces of the semiconductor elements 43b and 44b are bonded to the conductive patterns 23a2 and 23b3, respectively, with solder (not illustrated).

The following bonding wires 51a through 54a, 51b through 54b, 55, and 56 are wired on the ceramic circuit boards 20a and 20b and the semiconductor elements 41a through 44a and 41b through 44b. The bonding wires 51a and 52a, which are control wirings, are electrically connected to the conductive pattern 23a1 and are electrically connected to the control electrode 41a1 of the semiconductor element 41a and the control electrode 42a1 of the semiconductor element 42a respectively. The bonding wire 53a electrically connects the conductive pattern 23a3 and the main electrodes of the semiconductor elements 41a and 43a. The bonding wire 54a electrically connects the conductive pattern 23a3 and the main electrodes of the semiconductor elements 42a and 44a. The bonding wires 51b and 52b, which are control wirings, are electrically connected to the conductive pattern 23b4 and are electrically connected to the control electrode 41b1 of the semiconductor element 41b and the control electrode 42b1 of the semiconductor element 42b respectively. The bonding wire 53b electrically connects the conductive pattern 23b2 and the main electrodes of the semiconductor elements 41b and 43b. The bonding wire 54b electrically connects the conductive pattern 23b1 and the main electrodes of the semiconductor elements 42b and 44b. Furthermore, the bonding wire 55 electrically connects the conductive pattern 23a2 of the ceramic circuit board 20a and the conductive pattern 23b2 of the ceramic circuit board 20b. The bonding wire 56 electrically connects the conductive pattern 23a2 of the ceramic circuit board 20a and the conductive pattern 23b1 of the ceramic circuit board 20b. The bonding wires 51a through 54a, 51b through 54b, 55, and 56 are made of a material having good electrical conductivity. Metal, such as aluminum or copper, or an alloy containing at least one of them is used as such a material.

With the above ceramic circuit boards 20a and 20b one end portion of the first lead frame 71 is bonded to the conductive pattern 23b3. The main electrodes on the back surfaces of the semiconductor elements 41b, 42b, 43b, and 44b are also bonded to the conductive pattern 23b3. As a result, the first lead frame 71 is electrically connected to the main electrodes of the semiconductor elements 41b, 42b, 43b, and 44b and a principal current flows. Furthermore, one end portion of the second lead frame 72 is bonded to the conductive pattern 23a3. The conductive pattern 23a3 is electrically connected to the main electrodes on the front surfaces of the semiconductor elements 41a, 42a, 43a, and 44a via the bonding wires 53a and 54a. As a result, the second lead frame 72 is electrically connected to the main electrodes of the semiconductor elements 41a, 42a, 43a, and 44a and a principal current flows.

As illustrated in FIG. 1, the wiring unit 70 is arranged over the semiconductor elements 41b through 44b located over the ceramic circuit board 20b. In addition, the wiring unit 70 is arranged so as to leave the gap (second interface gap) between the wiring unit 70 and the sealing member 80. As illustrated in FIG. 3, the wiring unit 70 has the first lead frame 71, the second lead frame 72, and the wiring holding portion 73 which includes and holds the first lead frame 71 and the second lead frame 72. In FIG. 3, a position in which the wiring unit 70 is arranged is indicated by a dashed line.

The first lead frame 71 has a first wiring portion 71a, a first bonding portion 71b, and the first terminal portion 71c. The first wiring portion 71a is wired parallel to the front surface of the ceramic circuit board 20b. The first bonding portion 71b is integrally connected to a side of one end portion of the first wiring portion 71a, extends under the semiconductor device 10, and is bonded to the conductive pattern 23b3 with solder therebetween. The first bonding portion 71b may extend perpendicularly to the first wiring portion 71a from the side of the one end portion of the first wiring portion 71a to the front surface of the ceramic circuit board 20b. Furthermore, the first bonding portion 71b may include a portion which extends parallel to the first wiring portion 71a at a position at which the first bonding portion 71b is bonded to the conductive pattern 23b3. The first terminal portion 71c is integrally connected to the other end portion of the first wiring portion 71a, extends over the semiconductor device 10, and is exposed from the lid portion 61. The first terminal portion 71c may extend perpendicularly to the first wiring portion 71a in the direction opposite to the first bonding portion 71b from a side of the other end portion of the first wiring portion 71a. Moreover, the first terminal portion 71c may include a portion which extends parallel to the first wiring portion 71a along the front surface of the lid portion 61 at a position at which the first terminal portion 71c is exposed from the lid portion 61.

The second lead frame 72 has a second wiring portion 72a, a second bonding portion 72b, and the second terminal portion 72c. Part of the second wiring portion 72a is superimposed over the front surface of the first wiring portion 71a with a gap with the front surface of the first wiring portion 71a. The second wiring portion 72a may be equal in thickness and width to the first wiring portion 71a. Furthermore, the second wiring portion 72a is wired in the direction in which the first wiring portion 71a is wired. In this case, the position of the second wiring portion 72a deviates by a determined length to the side of the ceramic circuit board 20a in the direction in which the second wiring portion 72a is wired. The second bonding portion 72b is integrally connected to one end portion of the second wiring portion 72a, extends under the semiconductor device 10, and is bonded to the conductive pattern 23a3 with solder therebetween. The second bonding portion 72b may extend perpendicularly to the second wiring portion 72a from a side of the one end portion of the second wiring portion 72a to the front surface of the ceramic circuit board 20a. In this case, there is a gap between the first bonding portion 71b and the second bonding portion 72b. In addition, this gap connects with a gap between the first wiring portion 71a and the second wiring portion 72a. The gap between the first bonding portion 71b and the second bonding portion 72b is larger than the gap between the first wiring portion 71a and the second wiring portion 72a. Moreover, the second bonding portion 72b may include a portion which extends parallel to the second wiring portion 72a at a position at which the second bonding portion 72b is bonded to the conductive pattern 23a3. The second terminal portion 72c is integrally connected to the other end portion of the second wiring portion 72a, extends over the semiconductor device 10, and is exposed from the lid portion 61. The second terminal portion 72c may extend perpendicularly to the second wiring portion 72a in the direction opposite to the second bonding portion 72b from a side of the other end portion of the second wiring portion 72a. In this case, there is a gap between the first terminal portion 71c and the second terminal portion 72c. Furthermore, this gap connects with a gap between the first wiring portion 71a and the second wiring portion 72a. The gap between the first terminal portion 71c and the second terminal portion 72c is larger than the gap between the first wiring portion 71a and the second wiring portion 72a. Moreover, the second terminal portion 72c may include a portion which extends parallel to the second wiring portion 72a along the front surface of the lid portion 61 at a position at which the second terminal portion 72c is exposed from the lid portion 61. The portion of the first terminal portion 71c and the portion of the second terminal portion 72c which extend along the front surface of the lid portion may extend in opposite directions so that their end portions will be separated from each other.

The shape of the first bonding portion 71b, the second bonding portion 72b, the first terminal portion 71c, and the second terminal portion 72c illustrated in FIG. 3 is an example. The first bonding portion 71b and the second bonding portion 72b need only have a shape which electrically connects the first wiring portion 71a and the second wiring portion 72a to the conductive pattern 23b3 and the conductive pattern 23a3 respectively. Furthermore, the first terminal portion 71c and the second terminal portion 72c need only have a shape which is exposed from the lid portion 61 and which electrically connects the first terminal portion 71c and the second terminal portion 72c to an external device.

In addition, the third lead frame 74 has a third wiring portion 74a, a third bonding portion 74b, and the third terminal portion 74c. The third wiring portion 74a is wired parallel to the front surface of the ceramic circuit board 20a. The third bonding portion 74b is integrally connected to one end portion of the third wiring portion 74a and is bonded to the conductive pattern 23a2 with solder therebetween. The third terminal portion 74c is integrally connected to the other end portion of the third wiring portion 74a, extends over the semiconductor device 10, and is exposed from the lid portion 61.

The first through third lead frames 71, 72, and 74 are made of a material, such as aluminum, iron, silver, copper, or an alloy containing at least one of them, having good electrical conductivity. Furthermore, in order to improve corrosion resistance, plating treatment or the like may be performed on the surface of each of the first through third lead frames 71, 72, and 74 by the use of a plating material. Nickel, gold, a nickel-phosphorus alloy, or a nickel-boron alloy is taken as a concrete example of such a plating material. In addition, gold may be laminated over a nickel-phosphorus alloy. In the above description the first through third lead frames 71, 72, and 74 are bonded to the conductive patterns 23b3, 23a3, and 23a2, respectively, with solder. However, the first through third lead frames 71, 72, and 74 may be bonded to the conductive patterns 23b3, 23a3, and 23a2, respectively, with a sintered material such as silver solder or may be bonded directly to the conductive patterns 23b3, 23a3, and 23a2, respectively, by the use of ultrasonic waves or a laser.

As illustrated in FIG. 3, the wiring holding portion 73 has at least a wiring gap portion 73a and a wiring front surface portion 73b and includes the first lead frame 71 and the second lead frame 72 by them. Furthermore, the wiring holding portion 73 may have a terminal gap portion 73c, a wiring back surface portion 73d, and a bonding gap portion 73e. FIG. 3 illustrates a case where these portions are included. In this case, the wiring unit 70 is arranged over the semiconductor elements 41b through 44b and the gap (second interface gap) is left between the wiring back surface portion 73d, the bonding gap portion 73e, and the sealing member 80. The wiring gap portion 73a is located at least in a gap in a superimposition area 75 in which the second wiring portion 72a of the second lead frame 72 is superimposed over the first wiring portion 71a of the first lead frame 71. FIG. 3 illustrates a case where the wiring gap portion 73a extends to a region including the superimposition area 75. In addition, the terminal gap portion 73c may continue from the wiring gap portion 73a and be located in the lower part of the gap between the first terminal portion 71c and the second terminal portion 72c. In this case, the first terminal portion 71c and the second terminal portion 72c protrude from a front surface 73c1 of the terminal gap portion 73c. Moreover, the wiring front surface portion 73b is located at least on the outer surface (front surface) and sides of the second wiring portion 72a of the second lead frame 72 in the superimposition area 75 superimposed over the first wiring portion 71a. FIG. 3 illustrates a case where the wiring front surface portion 73b extends to the region including the superimposition area 75. Furthermore, the wiring front surface portion 73b may also be located on the outer surface of the lower part of the second terminal portion 72c and the outer surface of part of the second wiring portion 72a extending (to the left side in FIG. 3) from the superimposition area 75 in which the second wiring portion 72a is superimposed over the first wiring portion 71a. As a result, all the circumference of the second wiring portion 72a is covered with the wiring gap portion 73a and the wiring front surface portion 73b in the superimposition area 75 in which the second wiring portion 72a is superimposed over the first wiring portion 71a (FIG. 4C). With the first lead frame 71 and the second lead frame 72, a surface on the gap side is an inner surface and a surface on the opposite side of the inner surface or side is an outer surface.

Furthermore, if the wiring holding portion 73 has only the wiring gap portion 73a and the wiring front surface portion 73b, then the outer surface of the first lead frame 71 corresponding to the back surface of the wiring unit 70 is exposed. In this case, there is a gap (first interface gap) between the back surface of the first wiring portion 71a of the first lead frame 71 exposed and the sealing member 80. Furthermore, in this case, the inner surface of the second lead frame 72 that is not situated in the superimposition area 75 in which the second wiring portion 72a is superimposed over the first wiring portion 71a is also exposed. The insulating property of the gap between the first wiring portion 71a of the first lead frame 71 and the second wiring portion 72a of the second lead frame 72 is maintained by the wiring gap portion 73a of the wiring holding portion 73. In addition, insulation between the outer surface of the first wiring portion 71a of the first lead frame 71 and the outer surface of the second wiring portion 72a of the second lead frame 72 is maintained by the wiring front surface portion 73b of the wiring holding portion 73. The distance between the first terminal portion 71c and the second terminal portion 72c is ensured in the wiring unit 70 so that a short circuit will not occur between the first terminal portion 71c and the second terminal portion 72c along the front surface 73c1 depending on the magnitude of a current flowing or a voltage applied. The wiring unit 70 formed by integrally molding the wiring holding portion 73 and the first and second lead frames 71 and 72 is arranged in this way over the ceramic circuit boards 20a and 20b (for example, the position in which the wiring unit 70 is arranged is indicated by the dashed line in FIG. 3).

A gap is left between the wiring holding portion 73 (first wiring portion 71a if the wiring back surface portion 73d is not included) and the sealing member 80. As a result, even when the semiconductor device 10 thermally deforms, peeling of an interface between the semiconductor elements 41a through 44a and 41b through 44b and the sealing member 80 is suppressed. This improves the reliability of the semiconductor device 10. If there is no gap between the wiring holding portion 73 (first wiring portion 71a in the case of the wiring back surface portion 73d not being included) and the sealing member 80, then the sealing member 80 is drawn toward the wiring unit 70 when the semiconductor device 10 thermally deforms. As a result, an interface between the semiconductor elements 41a through 44a and 41b through 44b and the sealing member 80 may peel. This deteriorates the reliability of the semiconductor device 10.

For example, the wiring holding portion 73 having the above structure is made of a thermoplastic resin such as polyphenylene sulfide (PPS) resin, polybutylene terephthalate (PBT) resin, polybutylene succinate (PBS) resin, polyamide (PA) resin, or acrylonitrile butadiene styrene (ABS) resin.

The radiation plate 30 is made of a material, such as aluminum, iron, silver, copper, magnesium, or an alloy containing at least one of them, having high thermal conductivity. Furthermore, in order to improve corrosion resistance, plating treatment or the like may be performed on the surface of the radiation plate 30 by the use of a plating material. Nickel, a nickel-phosphorus alloy, or a nickel-boron alloy is taken as a concrete example of such a plating material. A cooler (not illustrated) may be fixed to the back surface of the radiation plate 30 with solder, silver solder, or the like therebetween to improve the heat dissipation property. For example, the cooler is made of a material, such as aluminum, iron, silver, copper, magnesium, or an alloy containing at least one of them, having high thermal conductivity. Furthermore, a fin, a heat sink made up of a plurality of fins, a water-cooling cooler, or the like may be used as the cooler. In addition, the radiation plate 30 and the cooler may be integrally formed. In that case, the radiation plate 30 and the cooler are made of a material, such as aluminum, iron, silver, copper, magnesium, or an alloy containing at least one of them, having high thermal conductivity. Moreover, in order to improve corrosion resistance, plating treatment or the like may be performed on the surface of the radiation plate 30 and the cooler integrally formed by the use of a plating material. Nickel, a nickel-phosphorus alloy, or a nickel-boron alloy is taken as a concrete example of such a plating material.

The case portion 60 has the shape of a frame and is arranged over an outer peripheral portion of the radiation plate 30. The case portion 60 has the shape of a box whose upper part is open. The lid portion 61 need only have a top plate 61a. Furthermore, the lid portion 61 may have a side 61b and have the shape of a box whose lower part is open. The lid portion 61 is arranged over the radiation plate 30 and the case portion 60. As a result, the shape of a box surrounded on six sides is formed. The boundary between the case portion 60 and the lid portion 61 may be above the sealing member 80 and below the first wiring portion 71a. The case portion 60 and the lid portion 61 are made of a thermoplastic resin such as PPS resin, PBT resin, PBS resin, PA resin, or ABS resin. In addition, the first through third terminal portions 71c, 72c, and 74c of the first through third lead frames 71, 72, and 74, respectively, are exposed on the front surface of the lid portion 61.

The sealing member 80 contains a thermosetting resin and a filling material contained in a thermosetting resin. A thermosetting resin is maleimide-modified epoxy resin, maleimide-modified phenolic resin, maleimide resin, or the like. Moreover, epoxy resin is taken as a concrete example. A filling material is contained as a filler in epoxy resin. A filling material is silicon oxide, aluminum oxide, boron nitride, aluminum nitride, or the like. In addition, silicone gel may be used as the sealing member 80. Furthermore, the case portion 60 is filled with the sealing member 80 to the lower part of the outer surface of the first lead frame 71 (first wiring portion 71a) of the wiring unit to seal the ceramic circuit boards 20a and 20b, the semiconductor elements 41a, 42a, 41b, and 42b, the bonding wires 51a through 54a, 51b through 54b, 55, and 56, and the like. As stated above, at this time the first and second lead frames 71 and 72 are sealed by the wiring holding portion 73 in the wiring unit 70. As a result, even if the first and second lead frames 71 and 72 are not sealed with the sealing member 80, insulation between them is maintained. Accordingly, the case portion 60 may be filled with the sealing member 80 to a level at which the ceramic circuit boards 20a and 20b, the semiconductor elements 41a, 42a, 41b, and 42b, and the bonding wires 51a through 54a, 51b through 54b, 55, and 56 are buried. Moreover, because the case portion 60 is filled with the sealing member 80, there is need to make the height of the case portion 60 greater than that of the sealing member 80. Accordingly, the height of the case portion 60 may be height corresponding to the ceramic circuit boards 20a and 20b, the semiconductor elements 41a, 42a, 41b, and 42b, and the bonding wires 51a through 54a, 51b through 54b, 55, and 56.

The semiconductor device 10 (FIG. 2 and FIG. 3) having the above structure realizes circuit structure illustrated in FIG. 5. This is an inverter circuit made up of upper and lower arms. With the semiconductor device 10 a collector electrode of a transistor T1 made up of the semiconductor elements 41b and 42b and a cathode electrode of a diode D1 made up of the semiconductor elements 43b and 44b are connected to the first lead frame 71 via the conductive pattern 23b3 and are connected to the first terminal portion 71c. The first terminal portion 71c is a positive electrode input terminal C1. The control electrodes 41b1 and 42b1 of the semiconductor elements 41b and 42b, respectively, are a gate electrode G1 of the transistor T1 and are connected to a terminal (not illustrated) via the bonding wires 51b and 52b and the conductive pattern 23b4. An emitter electrode of the transistor T1 and an anode electrode of the diode D1 are electrically connected via the bonding wires 53b and 54b. Furthermore, the emitter electrode of the transistor T1 is connected to the third lead frames 74 via the bonding wires 53b and 54b, the conductive patterns 23b2 and 23b1, the bonding wires 55 and 56, and the conductive pattern 23a2 and are connected to the third terminal portion 74c. The third terminal portion 74c is an output terminal C2E1.

In addition, a collector electrode of a transistor T2 made up of the semiconductor elements 41a and 42a and a cathode electrode of a diode D2 made up of the semiconductor elements 43a and 44a are connected to the third lead frame 74 via the conductive pattern 23a2 and are connected to the third terminal portion 74c. As stated above, the third terminal portion 74c is the output terminal C2E1. The control electrodes 41a1 and 42a1 of the semiconductor elements 41a and 42a, respectively, are a gate electrode G2 of the transistor T2 and are connected to a terminal (not illustrated) via the bonding wires 51a and 52a and the conductive pattern 23a1. An emitter electrode of the transistor T2 and an anode electrode of the diode D2 are electrically connected via the bonding wires 53a and 54a. Furthermore, the emitter electrode of the transistor T2 is connected to the second lead frames 72 via the bonding wires 53a and 54a and the conductive pattern 23a3 and are connected to the second terminal portion 72c. The second terminal portion 72c is a negative electrode input terminal E2.

Figure 6:
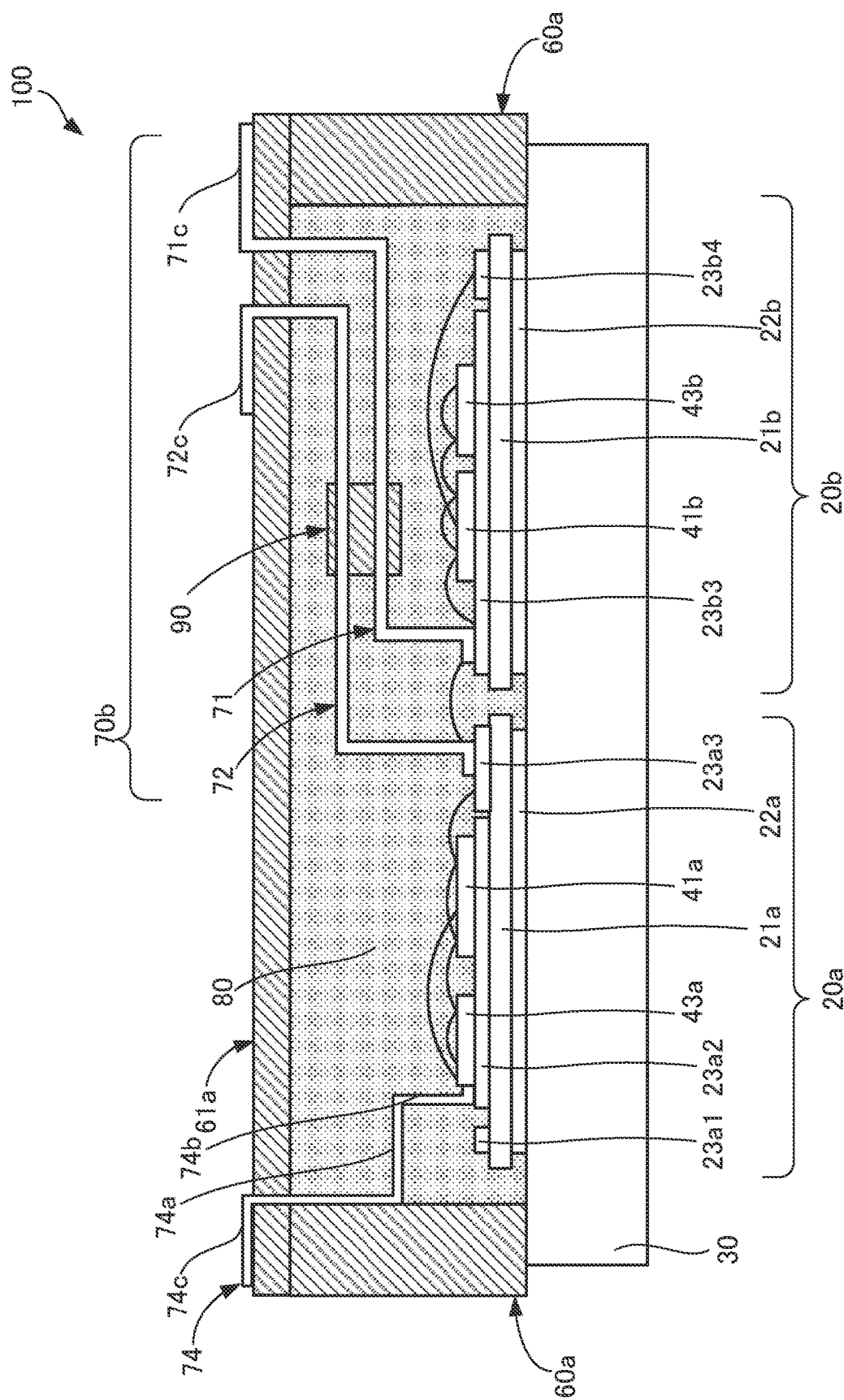
FIG. 6 is a sectional side elevation view of a semiconductor device taken as a reference example.

A semiconductor device other than the semiconductor device 10 taken as a reference example will now be described by the use of FIG. 6. FIG. 6 is a sectional side elevation view of a semiconductor device taken as a reference example. Components of a semiconductor device 100 of FIG. 6 which are the same as those of the semiconductor device 10 illustrated in FIG. 1 are marked with the same numerals and description of them will be omitted. With a wiring unit 70b included in the semiconductor device 100, first and second lead frames 71 and 72 are included in a wiring holding portion 90. The wiring holding portion 90 simply integrates the first and second lead frames 71 and 72 in the middle of first and second wiring portions 71a and 72a of the first and second lead frames 71 and 72 respectively. Accordingly, in order to maintain insulation between the first and second lead frames and 72 of the wiring unit 70b included in the semiconductor device 100, there is need to seal at least all the first and second wiring portions 71a and 72a with a sealing member 80. As a result, the height of a case portion 60a corresponds to at least the height of the first and second wiring portions 71a and 72a and is greater than that of the case portion 60 of the semiconductor device 10. Furthermore, the case portion 60a is sufficiently filled with the sealing member 80 so as to seal all the first and second wiring portions 71a and 72a. In addition, if the first and second wiring portions 71a and 72a are not sufficiently sealed with the sealing member 80, then a current flows through the air or along the surface of the sealing member 80 between the first and second wiring portions 71a and 72a of the first and second lead frames 71 and 72 respectively. As a result, a short circuit occurs.

On the other hand, the semiconductor device 10 includes the semiconductor elements 41a through 44a and 41b through 44b, the ceramic circuit boards 20a and 20b, and the wiring unit 70. The wiring unit 70 includes the first lead frame 71 electrically connected to the conductive pattern 23b3 and having the first wiring portion 71a wired parallel to the principal plane of the ceramic circuit board 20b, the second lead frame 72 electrically connected to the conductive pattern 23a3 and having the second wiring portion 72a superimposed over the first wiring portion 71a with a gap with the front surface of the first wiring portion 71a and wired in the direction in which the first wiring portion 71a is wired, and the wiring holding portion 73 including the first and second lead frames 71 and 72. The wiring holding portion 73 includes the wiring gap portion 73a with which the gap between the first wiring portion 71a and the second wiring portion 72a in the superimposition area 75 in which the second wiring portion 72a is superimposed over the first wiring portion 71a is filled and the wiring front surface portion 73b which covers the front surface and sides of the second wiring portion 72a in the superimposition area 75.

Accordingly, insulation between the first and second lead frames 71 and 72 is maintained. As a result, there is no need to seal the whole of the wiring unit 70 with the sealing member 80. The ceramic circuit boards 20a and 20b, the bonding wires 51a through 54a, 51b through 54b, 55, and 56, and the like are sealed. Accordingly, the amount of the sealing member 80 in the semiconductor device 10 is small compared with the semiconductor device 100. This makes the semiconductor device 10 lightweight. Furthermore, a reduction in the amount of the sealing member 80 suppresses the influence of the expansion or contraction of the sealing member 80 by heat. As a result, stress applied to the bonding wires 51a through 54a, 51b through 54b, 55, and 56 due to the expansion or contraction of the sealing member 80 is suppressed. Accordingly, peeling or the like of the bonding wires 51a through 54a, 51b through 54b, 55, and 56 is suppressed and durability is improved. In addition, because the amount of the sealing member 80 is reduced, the height of the case portion 60 is small compared with the semiconductor device 100.

This makes it easy for the case portion 60 to follow a warp of the radiation plate 30 and improves the crack resistance of the case portion 60. As a result, deterioration in the reliability of the semiconductor device 10 is suppressed.

The operation of the semiconductor device 10 really energized is as follows. With the semiconductor device 10 a current flows from the positive electrode input terminal C1, through the transistor T1, to the output terminal C2E1 when the transistor T1 is in an on state. That is to say, in the first lead frame 71 a current flows from the first terminal portion 71c, through the first wiring portion 71a, to the first bonding portion 71b. Furthermore, a current flows from the output terminal C2E1, through the transistor T2, to the negative electrode input terminal E2 when the transistor T2 is in an on state. That is to say, in the second lead frame a current flows from the second bonding portion 72b, through the second wiring portion 72a, to the second terminal portion 72c. Accordingly, a current flows along the first wiring portion 71a from right to left in FIG. 1 and a current flows along the second wiring portion 72a from left to right in FIG. 1.

With the semiconductor device 10 the currents flow in this way in opposite directions in the superimposition area 75 in which the second wiring portion 72a of the second lead frame 72 is superimposed over the first wiring portion 71a of the first lead frame 71. Furthermore, the wiring gap portion 73a is arranged in the gap between the first wiring portion 71a and the second wiring portion 72a in the superimposition area 75.

Accordingly, with the semiconductor device 10 it is possible to arrange the first wiring portion 71a and the second wiring portion 72a adjacently to each other while ensuring insulation between the first wiring portion 71a and the second wiring portion 72a. As a result, inductance is reduced and a loss is reduced.

Second Embodiment

Figure 7:
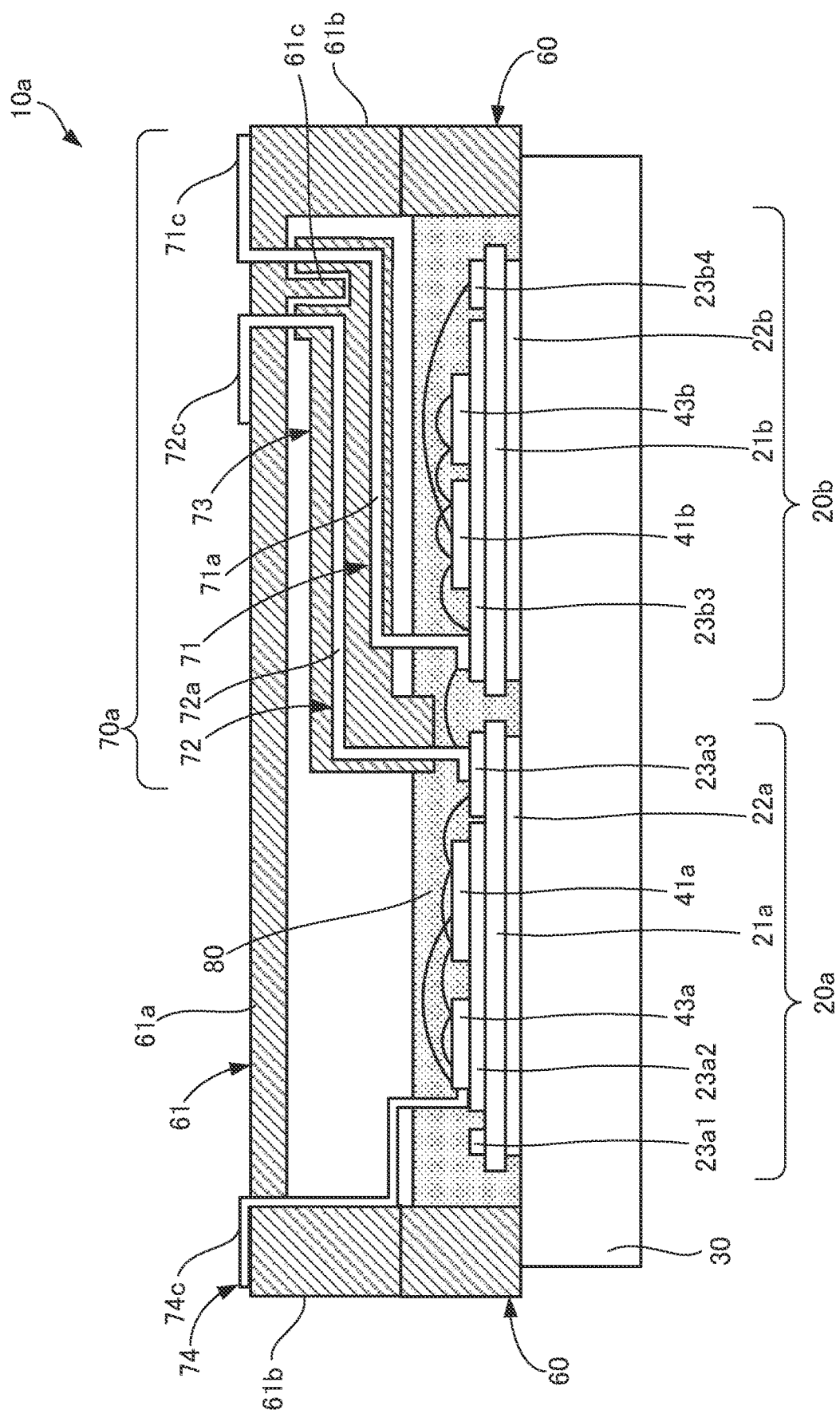
FIG. 7 is a sectional side elevation view of a semiconductor device according to a second embodiment.
Figure 8:
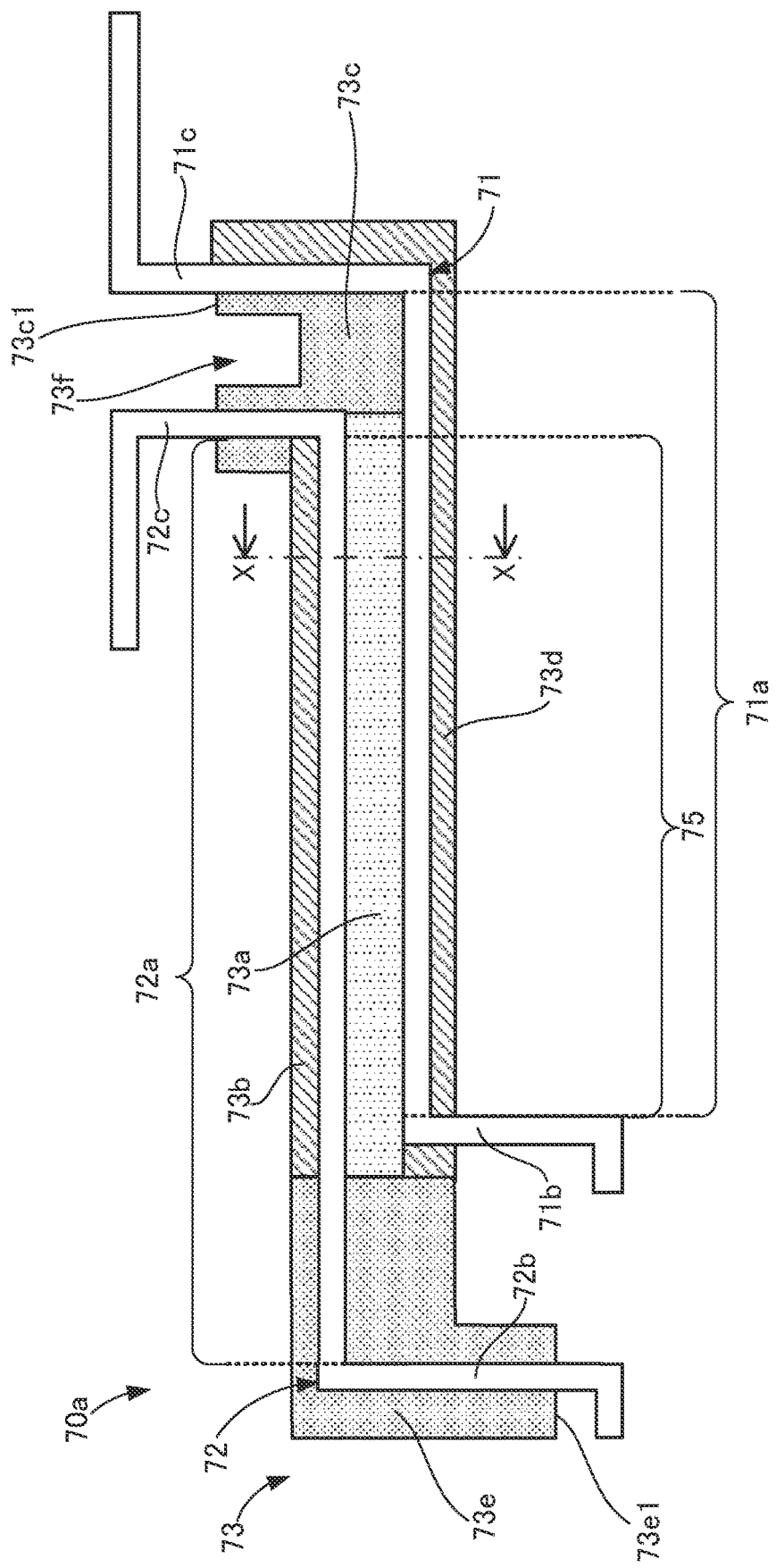
FIG. 8 is a view for describing a wiring unit included in the semiconductor device according to the second embodiment.

In a second embodiment a wiring unit which differs from that in the first embodiment will be described by the use of FIG. 7 and FIG. 8. FIG. 7 is a sectional side elevation view of a semiconductor device according to a second embodiment. FIG. 8 is a view for describing a wiring unit included in the semiconductor device according to the second embodiment. Furthermore, components of a semiconductor device 10a according to the second embodiment which are the same as those of the semiconductor device 10 are marked with the same numerals and description of them will be omitted. FIG. 7 corresponds to the sectional side elevation view of FIG. 1. In addition, FIG. 8 is a side view of a wiring unit 70a.

As illustrated in FIG. 7, the semiconductor device 10a also includes ceramic circuit boards 20a and 20b, a radiation plate 30 over whose front surface the ceramic circuit boards 20a and 20b are located, and the wiring unit 70a located over the ceramic circuit boards 20a and 20b. Furthermore, the semiconductor device 10a includes a case portion 60 which is located over a peripheral edge portion of the radiation plate 30 and which encloses the ceramic circuit boards 20a and 20b, a lid portion 61 located over an opening of the case portion 60, a sealing member 80 with which the case portion 60 is filled. A protrusion 61c is formed on the back surface (opposite the ceramic circuit boards 20a and 20b) of the lid portion 61.

As illustrated in FIG. 7 and FIG. 8, with the wiring unit 70a a wiring holding portion 73 further has a terminal gap portion 73c, a wiring back surface portion 73d, and a bonding gap portion 73e described in the first embodiment. In addition, a concave portion 73f is formed in a front surface 73c1 of the terminal gap portion 73c. When the wiring unit 70a is arranged over the ceramic circuit boards 20a and 20b and the lid portion 61 is put on, the protrusion 61c formed on the lid portion 61 fits into the concave portion 73f. Accordingly, the shape and size of the protrusion 61c are determined so that the protrusion 61c will fit into the concave portion 73f. In the wiring unit 70a, the upper side of a second bonding portion 72b of a second lead frame 72 and the under side of a second wiring portion 72a and a second terminal portion 72c of the second lead frame 72 are covered with the wiring holding portion 73. Moreover, the case portion 60 is filled with the sealing member 80 to a level above a bottom 73e1 of the bonding gap portion 73e of the wiring holding portion 73. With the semiconductor device 10a there is also a gap between the wiring holding portion 73 (first wiring portion 71a in the case of the wiring back surface portion 73d not being included) and the sealing member 80. In the case of FIG. 7 and FIG. 8, the lower part of the bonding gap portion 73e which covers the second bonding portion 72b is sealed with the sealing member 80. There is a gap (second interface gap) between part of the bonding gap portion 73e which covers the second wiring portion 72a and the sealing member 80. Furthermore, the semiconductor device 10a also includes the same circuit structure as the semiconductor device 10 according to the first embodiment includes.

For example, if the distance between the first terminal portion 71c and the second terminal portion 72c of the wiring unit 70 in the first embodiment is sufficiently short, then a current may flow along the front surface 73c1 between the first terminal portion 71c and the second terminal portion 72c. Furthermore, if the distance between the first terminal portion 71c and the second terminal portion 72c of the wiring unit 70 is sufficiently long and a sufficiently large current flows through the first lead frame and the second lead frame 72 or a sufficiently high voltage is applied to the first lead frame 71 and the second lead frame 72, then the same may occur.

Therefore, with the wiring unit 70a the concave portion 73f is formed in the front surface 73c1 of the terminal gap portion 73c with which a gap between the first terminal portion 71c and the second terminal portion 72c is filled. When this wiring unit 70a is fixed over the ceramic circuit boards 20a and 20b and the lid portion 61 is fixed, the protrusion 61c fits into the concave portion 73f. This increases the creepage distance between the first terminal portion 71c and the second terminal portion 72c. As a result, even if the distance between the first terminal portion 71c and the second terminal portion 72c is short and a sufficiently large current flows through the first lead frame and the second lead frame 72 or a sufficiently high voltage is applied to the first lead frame 71 and the second lead frame 72, insulation between the first lead frame 71 and the second lead frame 72 is maintained. Furthermore, even if a sufficiently large current flows through the first lead frame 71 and the second lead frame 72 or a sufficiently high voltage is applied to the first lead frame 71 and the second lead frame 72, insulation between the first lead frame 71 and the second lead frame 72 is maintained by the wiring back surface portion 73d and the bonding gap portion 73e of the wiring unit 70a. In addition, the upper side of the second bonding portion 72b of the second lead frame 72 and the under side of the second wiring portion 72a and the second terminal portion 72c of the second lead frame 72 are covered with the wiring holding portion 73. Moreover, the case portion 60 is filled with the sealing member 80 to a level above the bottom 73e1 of the bonding gap portion 73e of the wiring holding portion 73. As a result, even if a sufficiently large current flows through the first lead frame 71 and the second lead frame 72 or a sufficiently high voltage is applied to the first lead frame 71 and the second lead frame 72, insulation between the first lead frame 71 and the second lead frame 72 is maintained.

Accordingly, even if a current flowing through the semiconductor device 10a is larger than a current flowing through the semiconductor device 10 or a voltage applied to the semiconductor device 10a is higher than a voltage applied to the semiconductor device 10, insulation is reliably maintained in the semiconductor device 10a. Furthermore, the amount of the sealing member 80 in the semiconductor device 10a is also small compared with the semiconductor device 100. This makes the semiconductor device 10a lightweight. Furthermore, a reduction in the amount of the sealing member 80 suppresses the influence of the expansion or contraction of the sealing member 80 by heat. As a result, stress applied to bonding wires 51a through 54a, 51b through 54b, 55, and 56 due to the expansion or contraction of the sealing member 80 is suppressed. Accordingly, peeling or the like of the bonding wires 51a through 54a, 51b through 54b, 55, and 56 is suppressed and durability is improved. In addition, because the amount of the sealing member 80 is reduced, the height of the case portion 60 is small compared with the semiconductor device 100. This makes it easy for the case portion 60 to follow a warp of the radiation plate 30 and improves the crack resistance of the case portion 60. As a result, deterioration in the reliability of the semiconductor device 10a is suppressed.

The semiconductor device 10a also includes the same circuit structure as the semiconductor device 10 includes. As a result, a current flows along the first wiring portion 71a from right to left in FIG. 7 and a current flows along the second wiring portion 72a from left to right in FIG. 7. With the semiconductor device 10a the currents also flow in this way in opposite directions in a superimposition area 75 in which the second wiring portion 72a of the second lead frame 72 is superimposed over the first wiring portion 71a of the first lead frame 71. Furthermore, the wiring gap portion 73a is arranged in the gap between the first wiring portion 71a and the second wiring portion 72a in the superimposition area 75. Accordingly, with the semiconductor device 10a it is possible to arrange the first wiring portion 71a and the second wiring portion 72a adjacently to each other while ensuring insulation between the first wiring portion 71a and the second wiring portion 72a. As a result, inductance is reduced and a loss is reduced.

According to the disclosed technique, the occurrence of a short circuit is suppressed in a semiconductor device to which a high voltage is applied and deterioration in the reliability of the semiconductor device is suppressed.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
a semiconductor element having a first front surface;
a substrate which includes
an insulating board having a second front surface parallel to the first front surface of the semiconductor element, and
a first conductive plate and a second conductive plate that are disposed on the second front surface of the insulating board, the semiconductor element being disposed on the first conductive plate at a first side opposite to a second side in which the insulating board is disposed; and
a wiring unit including
a first lead frame electrically connected to the first conductive plate and having a first wiring portion disposed parallel to the first front surface of the semiconductor element and the second front surface of the insulating board and away from the first front surface of the semiconductor element such that a first gap is formed with no element between the first lead frame and the semiconductor element,
a second lead frame electrically connected to the second conductive plate and having a second wiring portion above the first lead frame and overlapping the first wiring portion in a plan view of the semiconductor device at a superimposed area of the second lead frame, a second gap between the first lead frame and the second lead frame being formed in the superimposed area in a direction orthogonal to the second front surface of the insulating board, and
a wiring holding portion holding the first lead frame and the second lead frame, the wiring holding portion including
a wiring gap portion which fills in the second gap in the superimposed area, and
a wiring surface portion disposed over the second wiring portion in the superimposed area.

2. The semiconductor device according to claim 1, further comprising:
a case which surrounds the substrate; and
a sealing member with which the case is filled so that an upper surface of the sealing member is positioned just under a back surface of the first wiring portion, and with which the substrate and the semiconductor element are sealed, the back surface of the first wiring portion being opposite to a front surface of the first wiring portion that faces the second wiring portion.

3. A semiconductor device, comprising:
a semiconductor element;
a substrate that includes
an insulating board having a front surface, and
a first conductive plate and a second conductive plate that are disposed on the front surface of the insulating board, the semiconductor element being disposed on one of the first and second conductive plates at a first side opposite to a second side in which the insulating board is disposed;

a wiring unit including
a first lead frame, electrically connected to the first conductive plate and having a first wiring portion wired parallel to the front surface of the insulating board,
a second lead frame, electrically connected to the second conductive plate and having a second wiring portion above the first lead frame and overlapping the first wiring portion in a plan view of the semiconductor device at a superimposed area of the second lead frame, a gap between the first lead frame and the second lead frame being formed in the superimposed area in a direction orthogonal to the front surface of the insulating board, and
a wiring holding portion holding the first lead frame and the second lead frame, the wiring holding portion including
a wiring gap portion which fills in the gap in the superimposed area, and
a wiring surface portion disposed over the second wiring portion in the superimposed area;
a case that surrounds the substrate; and
a sealing member with which the case is filled so that an upper surface of the sealing member is positioned just under a back surface of the first wiring portion, and with which the substrate and the semiconductor element are sealed, the back surface of the first wiring portion being opposite to a front surface of the first wiring portion that faces the second wiring portion, wherein
a first interface gap is formed between the first wiring portion and the sealing member.

4. The semiconductor device according to claim 2, wherein
the first lead frame further includes a first bonding portion and a first terminal portion, the first wiring portion being disposed between the first bonding portion and the first terminal portion, and
the first bonding portion is electrically connected to the first conductive plate, and the first terminal portion extends away from the substrate.

5. The semiconductor device according to claim 4, wherein
the second lead frame includes a second bonding portion and a second terminal portion, the second wiring portion being disposed between the second bonding portion and the second terminal portion, and
the second bonding portion is electrically connected to the second conductive plate and the second terminal portion extends away from the substrate.

6. A semiconductor device, comprising:
a semiconductor element;
a substrate that includes
an insulating board having a front surface, and
a first conductive plate and a second conductive plate that are disposed on the front surface of the insulating board, the semiconductor element being disposed on one of the first and second conductive plates at a first side opposite to a second side in which the insulating board is disposed; and
a wiring unit including
a first lead frame, electrically connected to the first conductive plate and having a first wiring portion wired parallel to the first front surface of the insulating board,
a second lead frame, electrically connected to the second conductive plate and having a second wiring portion above the first lead frame and overlapping the first wiring portion in a plan view of the semiconductor device at a superimposed area of the second lead frame, a gap between the first lead frame and the second lead frame being formed in the superimposed area in a direction orthogonal to the front surface of the insulating board, and a wiring holding portion holding the first lead frame and the second lead frame, the wiring holding portion including a wiring gap portion which fills in the gap in the superimposed area, and a wiring surface portion disposed over the second wiring portion in the superimposed area;

a case that surrounds the substrate;

a sealing member with which the case is filled so that an upper surface of the sealing member is positioned just under a back surface of the first wiring portion, and with which the substrate and the semiconductor element are sealed, the back surface of the first wiring portion being opposite to a front surface of the first wiring portion that faces the second wiring portion; and a lid portion disposed over the case, wherein the first lead frame further includes a first bonding portion and a first terminal portion, the first wiring portion being disposed between the first bonding portion and the first terminal portion, the first bonding portion being electrically connected to the first conductive plate, and the first terminal portion extending in a direction away from the substrate, the second lead frame includes a second bonding portion and a second terminal portion, the second wiring portion being disposed between the second bonding portion and the second terminal portion, the second bonding portion is electrically connected to the second conductive plate and the second terminal portion extends away from the substrate, and the first terminal portion and the second terminal portion each are arranged from inside the case to be exposed outside the lid portion.

7. The semiconductor device according to claim 6, wherein a bottom of the lid portion is located at a position between the upper surface of the sealing member and the back surface of the first wiring portion in a depth direction orthogonal to the front surface of the insulating board.

8. The semiconductor device according to claim 7, wherein the wiring holding portion further includes a bonding gap portion disposed under the second terminal portion at an area other than the superimposed area and between the first bonding portion and an area surrounding the second bonding portion.

9. The semiconductor device according to claim 6, wherein the wiring holding portion further includes a terminal gap portion under the lid portion between the first terminal portion and the second terminal portion, the terminal gap portion being connected to the wiring gap portion.

10. The semiconductor device according to claim 9, wherein:

the terminal gap portion has a concave portion at a surface thereof; and the lid portion having a protrusion at a position corresponding to a position of the concave portion in the plan view so that the protrusion fits into the concave portion.

11. The semiconductor device according to claim 4, wherein the wiring holding portion further includes a wiring back surface portion disposed under the back surface of the first terminal portion and at a first side of the first terminal portion opposite to a second side of the first terminal portion facing the second terminal portion.

12. The semiconductor device according to claim 11, wherein a second interface gap is formed between the wiring back surface portion and the upper surface of the sealing member.

13. The semiconductor device according to claim 1, wherein the first lead frame further includes a first bonding portion, and the first lead frame is electrically connected to the first conductive plate only at the first bonding portion, the first wiring portion being electrically connected to the semiconductor element only through the first bonding portion.

\* \* \* \* \*